US011742806B2

(12) United States Patent
Xu et al.

(10) Patent No.: US 11,742,806 B2
(45) Date of Patent: Aug. 29, 2023

(54) MULTIPLE INPUTS MULTIPLE OUPUTS RF FRONT-END AMPLIFIER CIRCUIT, CHIP AND METHOD FOR CONFIGURING SIGNAL PATH

(71) Applicant: Montage LZ Technologies (Shanghai) Co., Ltd., Shanghai (CN)

(72) Inventors: Jun Xu, Shanghai (CN); Shunfang Wu, Shanghai (CN); Shawn Si, Shanghai (CN)

(73) Assignee: Montage LZ Technologies (Shanghai) Co., Ltd., Shanghai (CN)

( * ) Notice: Subject to any disclaimer, the term of this patent is extended or adjusted under 35 U.S.C. 154(b) by 301 days.

(21) Appl. No.: 17/213,269

(22) Filed: Mar. 26, 2021

(65) Prior Publication Data
US 2022/0209725 A1  Jun. 30, 2022

(30) Foreign Application Priority Data

Dec. 29, 2020 (CN) .......................... 2020115895132

(51) Int. Cl.
*H03F 3/68* (2006.01)
*H03F 3/193* (2006.01)
*H03F 1/56* (2006.01)

(52) U.S. Cl.
CPC ............. *H03F 3/193* (2013.01); *H03F 1/56* (2013.01); *H03F 2200/222* (2013.01); *H03F 2200/451* (2013.01)

(58) Field of Classification Search
CPC .......................................................... H03F 3/68
USPC ...................................... 330/126, 124 R, 295
See application file for complete search history.

(56) References Cited

U.S. PATENT DOCUMENTS

| | | | |
|---|---|---|---|
| 6,104,231 A * | 8/2000 | Kirkpatrick, II | G01R 33/07 327/513 |
| 6,121,830 A * | 9/2000 | Manninen | H03G 1/0088 330/69 |
| 6,208,174 B1 * | 3/2001 | Hopkins | H03F 3/3023 327/66 |
| 7,948,315 B2 * | 5/2011 | Shifrin | H03F 3/45183 330/254 |
| 2007/0170972 A1 * | 7/2007 | Staveren | G06G 7/24 327/350 |

* cited by examiner

*Primary Examiner* — Henry Choe

(57) ABSTRACT

The present disclosure provides a Multiple Inputs Multiple Outputs RF front-end amplifier circuit, chip, and electronic device and a method for configuring signal path. The RF front-end amplifier circuit includes: at least two low-noise amplifying modules, each of which amplifies one voltage signal and converts into one or more intermediate current signals; a voltage output module, connected to each of the low-noise amplifying modules, for combining the intermediate current signal output by the low-noise amplifying module and converting them into one or more output voltage signals. The RF front-end amplifier circuit can be applied to an RF front-end with a Multiple Inputs Multiple Outputs structure.

9 Claims, 10 Drawing Sheets

MULTIPLE INPUTS MULTIPLE OUPUTS RF FRONT-END AMPLIFIER CIRCUIT, CHIP AND METHOD FOR CONFIGURING SIGNAL PATH

CROSS REFERENCE TO RELATED APPLICATION

The present application claims the benefit of priority to Chinese Patent Application No. CN 2020115895132, entitled "RF Front-End Amplifier Circuit, Chip, Electronic Device and Method for Configuring Signal Path", filed on Dec. 29, 2020, the disclosure of which is incorporated herein by reference in its entirety.

TECHNICAL FIELD

The present disclosure belongs to the field of communication technology, generally relates to an RF front-end amplifier circuit, in particular, to an multiple inputs multiple outputs RF front-end amplifier circuit, chip and method for configuring signal path.

BACKGROUND

RF front ends are increasingly being designed with a Multiple Inputs Multiple Outputs (MIMO) structure. For example, more and more set-top boxes are now designed with multiple tuners in order to simultaneously receive signals on multiple frequency channels from the same signal source. In addition, set-top boxes are increasingly being designed with multiple inputs, to receive signals from two or more signal sources. For example, satellite set-top boxes are designed to receive signals from two or more Low Noise Blocks, or receive signals on additional frequency channels outside the traditional satellite intermediate frequency band (950 MH-2150 MHz). However, traditional RF front ends are usually designed to receive signal on a single frequency channel from a single signal source, and the RF front-end amplifier circuit adopted is also designed with a single input and a single output, it is difficult to be applied in RF front ends with a MIMO structure. Therefore, how to design a RF front-end amplifier circuit suitable for MIMO scenarios has become a challenge.

SUMMARY

The present disclosure provides an RF front-end amplifier circuit, which amplifies one or more input voltage signals and converting them into one or more output voltage signals. The RF front-end amplifier circuit comprises: at least two low-noise amplifying modules, each of the low-noise amplifying modules is used to amplify and convert one input voltage signal into one or more intermediate current signals; and a voltage output module, connected to each of the low-noise amplifying modules and used to combine and convert the intermediate current signal output by each of the low-noise amplifying modules into the one or more output voltage signals.

In an embodiment, the intermediate current signal includes a first current signal and a second current signal, the low-noise amplifying modules includes: a first processing unit, which amplifies and converts one input voltage signal input to the low-noise amplifying module into one or more of the first current signals; and a second processing unit, which achieves impedance matching at an input terminal of the low-noise amplifying module, and amplifies one input voltage signal input to the low-noise amplifying module and converts it into one or more of the second current signals, wherein the number of the second current signals is the same as the number of the first current signals.

In an embodiment, the first processing unit comprises: a first amplifier, which amplifies an input voltage signal input to the low-noise amplifying module to obtain a first voltage signal; and at least one switchable first transconductor; each of the first transconductor is connected to the first amplifier, and converts the first voltage signal into a first current signal.

In an embodiment, the first amplifier comprises: a third transconductor, which converts an input voltage signal input to the low-noise amplifying module into a third current signal; and a first MOSFET, the gate and drain of the first MOSFET are connected, the gate is connected to each of the at least one first transconductor to form at least one current mirror, and the drain is connected to the third transconductor, wherein the first MOSFET generates the first voltage signal on its gate based on the third current signal.

In an embodiment, the second processing unit comprises: a matching amplifying circuit, which achieves impedance matching at the input terminal of the low-noise amplifying module, amplifies an input voltage signal input to the low-noise amplifying module to obtain a second voltage signal, converts the second voltage signal into a feedback signal and feeds it back to the input terminal of the low-noise amplifying module; and at least one switchable second transconductor, wherein each of the second transconductor is connected to the matching amplifying circuit, and converts the second voltage signal into the one of the second current signals.

In an embodiment, the matching amplifying circuit comprises: a second amplifier, which amplifies one input voltage signal input to the low-noise amplifying module to obtain a second voltage signal; and a feedback circuit, connected to the second amplifier and the input terminal of the low-noise amplifying module, wherein the feedback circuit converts the second voltage signal into the feedback signal and feeds it back to the input terminal of the low-noise amplifying module.

In an embodiment, the voltage output module comprise: at least one current combining unit, which combines the first current signal and the second current signal output by at least two low-noise amplifying modules to obtain a fourth current signal; and at least one current-voltage conversion unit, respectively connected to a corresponding current combining unit, wherein the at least one current-voltage conversion unit converts the fourth current signal into the output voltage signal.

In an embodiment, the first current signal and the second current signal are single-ended signals, or the first current signal and the second current signal are differential signals.

The present disclosure provides a chip, wherein the chip includes the RF front-end amplifier circuit disclosed herein.

The present disclosure provides an electronic device, wherein the electronic device includes the RF front-end amplifier circuit disclosed herein.

The present disclosure also provides a method for configuring signal path, the method for configuring signal path is applied in an RF front-end amplifier circuit for amplifying one or more input voltage signals and converting them into one or more output voltage signals, the RF front-end amplifier circuit comprises at least two low-noise amplifying modules and a voltage output module, each of the low-noise amplifying modules is used to amplify and convert one input voltage signal into one or more intermediate current signals, the voltage output module is connected to each of the low-noise amplifying modules and used to combine and convert the intermediate current signal output by each of the low-noise amplifying modules into the one or more output voltage signals, the method for configuring signal path comprises: acquiring an input-output correspondence table, wherein the input-output correspondence table describes the correspondence between the input voltage signal and the output voltage signal; and configuring signal path in the RF front-end amplifier circuit according to the input-output correspondence table.

DETAILED DESCRIPTION

Figure 1:
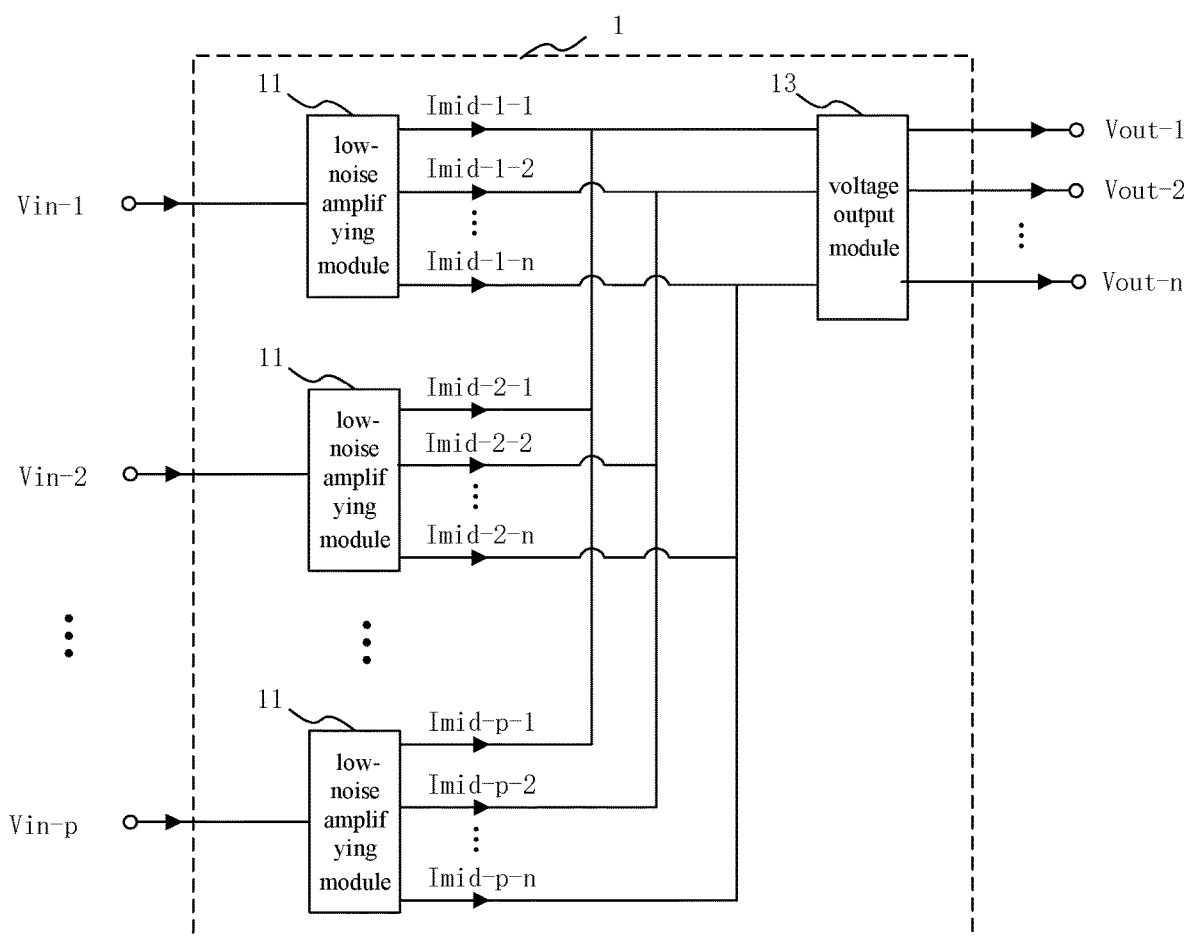
FIG. 1 shows a schematic diagram of the structure of an RF front-end amplifier circuit according to an embodiment of the present disclosure.

One or more specific embodiments of the present disclosure will be described below. These described embodiments are only examples of the presently disclosed techniques, and are not intended to limit aspects of the presently disclosed disclosure. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

In addition, herein, terms such as "first", "second", etc. are only used to distinguish one entity or operation from another entity or operation, and do not necessarily require these entities or operations be in a certain order.

Existing receiver system usually adopts discrete devices, low-noise amplifier with multiple radio frequency (RF) switches and common-source current splitting and combining circuit to receive signal from multiple frequency channels simultaneously and/or receive signal from one or more signal sources. But, these solutions face problems that make it difficult for them to be applied in typical Multiple Inputs Multiple Outputs (MIMO) scenario. The performance of discrete devices often has many limitations, which limits the overall performance of the receiver. The discrete devices also need to occupy a large amount of printed circuit board (PCB) area, which increases the cost. The low-noise amplifier with multiple RF switches requires the RF switches to be inserted between first-stage low-noise amplifiers and second-stage low-noise amplifiers. By controlling the on-and-off state of these RF switches, the low-noise amplifier transmits one or more required input signals to one or more output terminals. However, these RF switches will inevitably introduce signal loss, which will cause the noise figure of the entire receiving system to deteriorate. In addition, when the switches are inserted in circuit nodes that require a large voltage swing, such as output nodes of the first-stage low-noise amplifiers, the linearity of the signals will be limited, and the signals will be distorted. The common-source current splitting and combining circuit normally requires source inductance degeneration to achieve impedance matching, which will limit its application in broadband scenarios. In addition, when a signal from one input terminal needs to be transmitted to multiple output terminals, current splitting will lead to degradation of the signal-to-noise ratio In light of the above mentioned problems, the present disclosure provides an RF front-end amplifier circuit, and the RF front-end amplifier circuit includes at least two low-noise amplifying modules, used to amplify and convert one or more input voltage signals into one or more intermediate current signals, and a voltage output module, used to combine the intermediate current signals and convert them into one or more output voltage signals, so as to realize the conversion of one or more input voltage signals into one or more output voltage signals. Therefore, the RF front-end amplifier circuit can be applied to a RF front-end with a MIMO structure.

In an embodiment, the RF front-end amplifier circuit includes at least two low-noise amplifying modules and a voltage output module. The number of the low-noise amplifying modules depends on the number of RF signal sources that need to be received. In some embodiments, the low-noise amplifying modules are low-noise transconductance amplifiers. Each of the low-noise amplifying modules is used to amplify one input voltage signal of the RF front-end amplifier circuit and convert it into one or more intermediate current signals. Specifically, the RF front-end amplifier circuit has two or more input terminals and two or more output terminals. Each of the input terminals corresponds to one input voltage signal, and each of the output terminals corresponds to one output voltage signal. The number of input terminals of the RF front-end amplifier circuit is the same as the number of the low-noise amplifying modules, and each of the input terminals of the RF front-end amplifier circuit are connected to its corresponding low-noise amplifying module. In applications, one input voltage signal is input to a corresponding low-noise amplifying module through an input terminal of the RF front-end amplifier circuit, and then the low-noise amplifying module amplifies the input voltage signal and converts it into one or more intermediate current signals. For example, referring to FIG. 1, the RF front-end amplifier circuit includes p low-noise amplifying modules, where p is greater than or equal to 1, and includes a voltage output module. An input voltage signal Vin-1 is input from an input terminal of the RF front-end amplifier circuit 1 to one of the low-noise amplifying modules 11, and then, the low-noise amplifying module 11 amplifies the input voltage signal Vin-1 and converts it into multiple intermediate current signals Imid-1-1, Imid-1-2, . . . , Imid-1-*n*, where n is an integer greater than or equal to 2. In specific applications, the number of intermediate current signals output by any of the low-noise amplifying modules 11 is less than or equal to the number of output terminals of the RF front-end amplifier circuit 1.

The voltage output module is connected to each of the low-noise amplifying modules, and is used to combine corresponding intermediate current signals output by the low-noise amplifying modules and convert them into the one or more output voltage signals. For example, the voltage output module 13 combines intermediate current signals Imid-1-1, Imid-2-1, . . . , Imid-p-1 and converts the combined current signal into an output voltage signal Vout-1, the voltage output module 13 combines intermediate current signals Imid-1-2, Imid-2-2, . . . , Imid-p-2 and converts the combined current signal into an output voltage signal Vout-2, and so on.

According to the above description, the RF front-end amplifier circuit disclosed hereon can process one or more RF input voltage signals to obtain one or more output voltage signals. Therefore, the RF front-end amplifier circuit is suitable for MIMO scenarios.

In addition, the input of the voltage output module in the above embodiment is current signal instead of voltage signal. Therefore, the voltage output module has low input impedance. Therefore, the voltage output module can receive intermediate current signals from multiple low-noise amplifying modules, and introduce little signal loss and distortion at operating frequencies up to several gigahertz.

In addition, the low input impedance can ensure that the mutual influence between different signal paths is minimal. In the present disclosure, a "signal path" refers to the path from an input voltage signal to its corresponding output voltage signal.

Each low-noise amplifying module 11 includes a first processing unit and a second processing unit. The intermediate current signal includes one or more first current signals output by the first processing unit, and one or more second current signals output by the second processing unit. Specifically, input terminals of the first processing unit and the second processing unit are connected at a common end, and an input voltage of the low-noise amplifying module is input through the common end to the first processing unit and the second processing unit. The first processing unit is used to amplify and convert the input voltage signal input to the low-noise amplifying module into one or more first current signals. The second processing unit is used to achieve impedance matching at input terminal of the low-noise amplifying module, and is used to amplify the input voltage signal of the low-noise amplifying module and convert it into one or more second current signals. The number of the second current signals is the same as the number of the first current signals.

In an embodiment, the first processing unit includes a first amplifier and at least one switchable first transconductor. The first amplifier is used to amplify the input voltage signal input to the low-noise amplifying module to obtain a first voltage signal. In an embodiment, the first amplifier is a low-noise voltage amplifier (LNA). Each of the at least one switchable first transconductor is connected to the first amplifier, and converts the first voltage signal into one of the first current signals. The output of all the first transconductors is the output of the first processing unit. The first transconductor may be realized with a Metal-Oxide-Semiconductor Field-Effect Transistor (MOSFET). In an embodiment, through adjusting the number of the at least one first transconductor, the first processing unit is able to output any number of the first current signals. For example, referring to FIG. 2, the first amplifier (A1) 111 amplifies the input voltage signal Vin-1, and a first voltage signal V1 is obtained; the at least one first transconductor 112 includes GM1-1-1, GM1-1-2, . . . , GM1-1-*n*. Among them, a first transconductor GM1-1-1 converts the first voltage signal V1 into a first current signal Iom1-1, and a first transconductor GM1-1-2 converts the first voltage signal V1 into a first current signal Iom1-2, and so on.

According to the above description, the first processing unit has one or more first current paths, and each of the first current paths includes a first transconductor and corresponds to one of the first current signals. The first transconductor here is switchable, which has at least two states of on and off, and is used to control the on and off of the first current paths.

Figure 2:
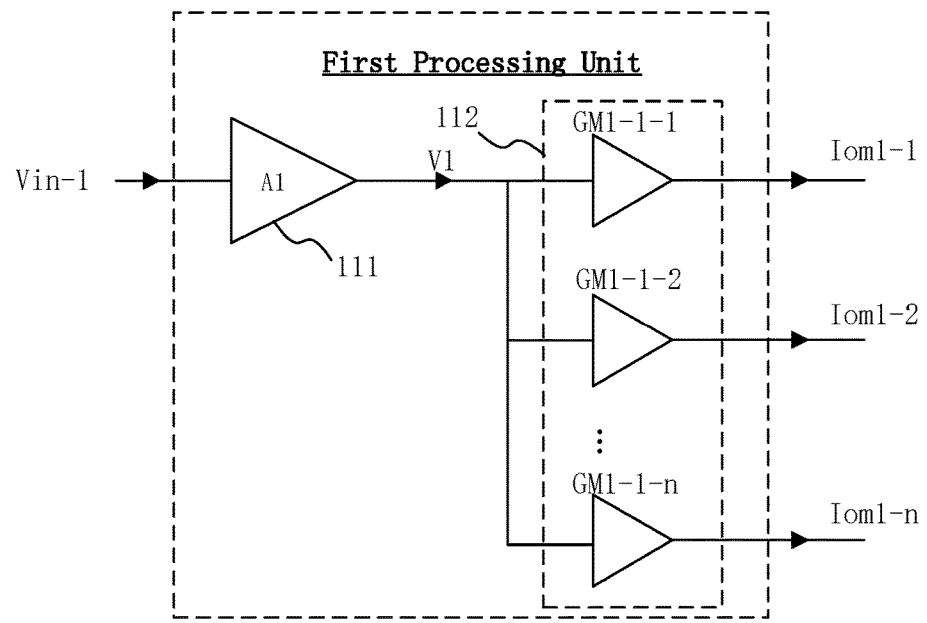
FIG. 2 shows a circuit diagram of a first processing unit of an RF front-end amplifier circuit according to an embodiment of the present disclosure.

For example, a first current path in FIG. 2 includes the first transconductor GM1-1-1 and corresponds to the first current signal Iom1-1. The first current path can be controlled by switching the first transconductor GM1-1-1 on or off: when the first transconductor GM1-1-1 is on, the first current path outputs the first current signal Iom1-1; when the first transconductor GM1-1-1 is off, the first current path does not output the current signal. In an embodiment, the state of each of the first transconductors is independent of each other. For a first processing unit with n first transconductors, controlling the switching state of each first transconductor will make the first processing unit convert one input voltage signal into any number between 0 and n of first current signals, and make the first processing unit to output one first current signal through any one of the first current paths, or output two or more first current signals through any two or more of the first current paths.

In an embodiment, the first amplifier includes a third transconductor and a first MOSFET, and the gate and drain of the first MOSFET are connected to form a diode. The third transconductor is used to convert the input voltage signal input to the low-noise amplifying module into a third current signal. The first MOSFET generates the first voltage signal on its gate based on the third current signal. The gate of the first MOSFET and each of the at least one first transconductor are connected to form one or more corresponding current mirrors, and the third current signal forms one or more first current signals through each of the current mirrors.

Figure 3:
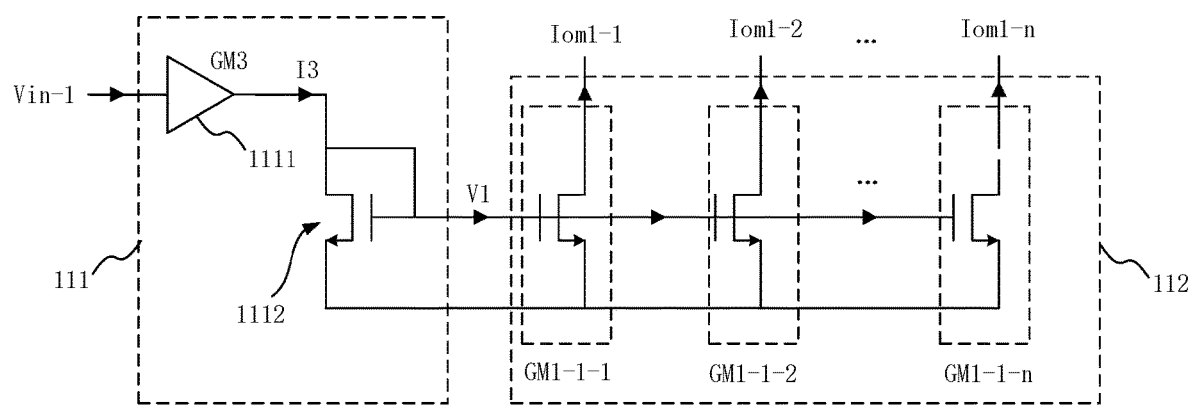
FIG. 3 shows a circuit diagram of a first processing unit of an RF front-end amplifier circuit according to an embodiment of the present disclosure.

For example, referring to FIG. 3, in the first amplifier 111, the third transconductor 1111 converts the input voltage signal Vin-1 input to a corresponding low-noise amplifying module into a third current signal I3, and the third current signal I3 flows into a common end of the gate and drain of the MOSFET 1112, and the first voltage signal V1 is generated at the common end. The first MOSFET 1112 and the first transconductor GM1-1-1 constitute a current mirror, and the output of the current mirror is a first current signal Iom1-1; the second MOSFET 1112 and the first transconductor GM1-1-2 constitutes another current mirror, and the output of the current mirror is another first current signal Iom1-2, and so on.

The first MOSFET is connected to each of the at least one first transconductor to form one or more corresponding current mirrors, and inside each of the current mirrors, the third current signal output by the third transconductor is converted into a voltage signal across the diode-connected MOSFET, and the voltage signal is then converted into one or more first current signals and output by the first transconductor inside each current mirror. Although the output of the first amplifier is a voltage signal, the existence of the current mirrors can ensure that the linearity of the signal will not be degraded, and thus can ensure that the first transconductor has good linearity.

It should be noted that, in the present disclosure a single-ended signal is taken as an example to introduce the first amplifier. In practical applications, the structure of the first amplifier can be adjusted to have the ability of processing differential signal.

In an embodiment, the second processing unit includes a matching amplifying circuit and at least one switchable second transconductor. The matching amplifying circuit is used to achieve impedance matching at the input terminal of the low-noise amplifying module, and to amplify the input voltage signal input to the low-noise amplifying module to obtain a second voltage signal. The second voltage signal is converted into a feedback signal, which is fed back to the input terminal of the low-noise amplifying module. Each of the at least one second transconductor is connected to the matching amplifying circuit, for converting the second voltage signal into one of the second current signals, and the output of the at least one second transconductor is the output of the second processing unit. The second transconductor may be realized with MOSFETs. In a specific application, by configuring the number of the at least one second transconductor, the second processing unit can output any number of the second current signals. It should be noted that during the configuration process, it should be ensured that the number of the second current signals is the same as the number of the first current signals.

Figure 4:
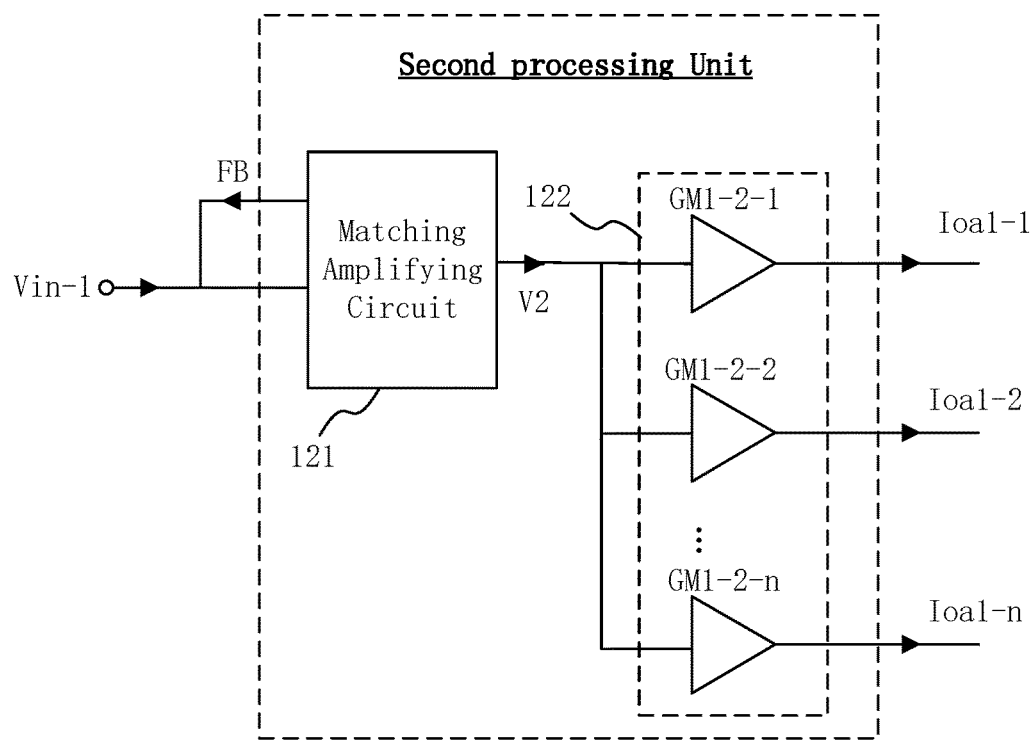
FIG. 4 shows a circuit diagram of a second processing unit of an RF front-end amplifier circuit according to an embodiment of the present disclosure.

For example, referring to FIG. 4, the matching amplifying circuit 121 is used to achieve impedance matching of the input terminal of the second processing unit, and amplify the input voltage signal Vin-1 to obtain a second voltage signal V2, and convert the second voltage signal V2 into a feedback signal FB and feed it back to the input terminal of the low-noise amplifying module; the second transconductor 122 includes GM1-2-1, GM1-2-2, . . . , GM1-2-*n*. A second transconductor GM1-2-1 converts the second voltage signal V2 into a second current signal Ioa1-1, a second transconductor GM1-2-2 converts the second voltage signal V2 into another second current signal Ioa1-2, and so on.

According to the above description, there are one or more second current paths in the second processing unit, and each second current path includes a second transconductor and corresponds to a second current signal. In an embodiment, each of the at least one second transconductor is switchable, has at least two states of on and off, and is used to control the on and off of the second current path. For example, a second current path in FIG. 4 includes the second transconductor GM1-2-1 and corresponds to the second current signal Ioa1-1. By switching the second transconductor GM1-2-1, the second current path can be controlled to be on or off: when the second transconductor GM1-2-1 is on, the second current path outputs the second current signal Ioa1-1; when the second transconductor GM1-2-1 is off, the second current path does not output a current signal. In an embodiment, the switching state of each of the at least one second transconductor is independent of each other. For a second processing unit with n second transconductors, by controlling the switching state of each second transconductor, the second processing unit can convert one input voltage signal into any number between 0 and n of second current signals, so that the second processing unit can output one second current signal through any one second current path, or output two or more second current signals through any two or more second current paths.

The matching amplifying circuit can amplify a voltage signal at its input terminal. Therefore, the matching amplifying circuit can suppress the noise of the at least one second transconductor, so the noise of the second transconductor will not become the main noise in the RF front-end amplifier circuit, thereby providing sufficient freedom in the design of the second transconductor, and allowing the second transconductor to be designed with a higher linearity.

Figure 5:
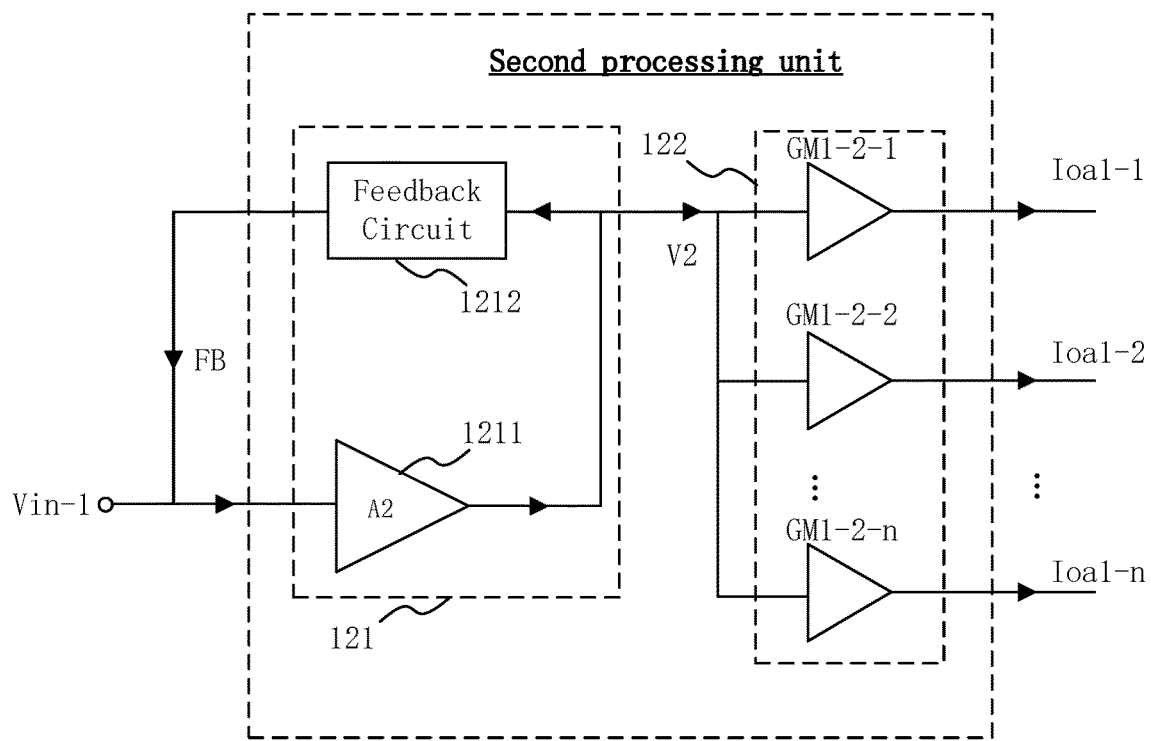
FIG. 5 shows a circuit diagram of a second processing unit of an RF front-end amplifier circuit according to an embodiment of the present disclosure.

Referring to FIG. 5, in an embodiment, the matching amplifying circuit includes a second amplifier and a feedback circuit. The second amplifier is used to amplify the input voltage signal input to the low-noise amplifying module to obtain a second voltage signal; the feedback circuit and the second amplifier is connected to the input terminal of the low-noise amplifying modules and are used to convert the second voltage signal into the feedback signal and feed it back to the input terminal of the low-noise amplifying module. As shown in FIG. 5, the second amplifier (A2) 1211 amplifies the input voltage signal Vin-1 to obtain a second voltage signal V2, and the feedback circuit 1212 converts the second voltage signal V2 into a feedback signal FB and feeds it back to the input terminal of the second processing unit. The second amplifier 1211 and the feedback circuit 1212 realize the input impedance matching of the low-noise amplifying module together.

In applications, the matching amplifying circuit may generate noise, which would be the main noise in the RF front-end amplifier circuit. The second voltage signal contains all or part of noise voltage generated by the matching amplifying circuit. The noise voltage is transferred to the input terminal of the low-noise amplifying module through the feedback circuit, and forms a first noise current after passing through the first transconductor of the first processing unit. Meanwhile, the noise voltage passes through the second transconductor of the second processing unit and forms a second noise current. In order to reduce or even eliminate the noise generated in the matching amplifier circuit, in an embodiment, the circuit can be properly designed to ensure that the phases of the first noise current and the first noise current are opposite.

Figure 6:
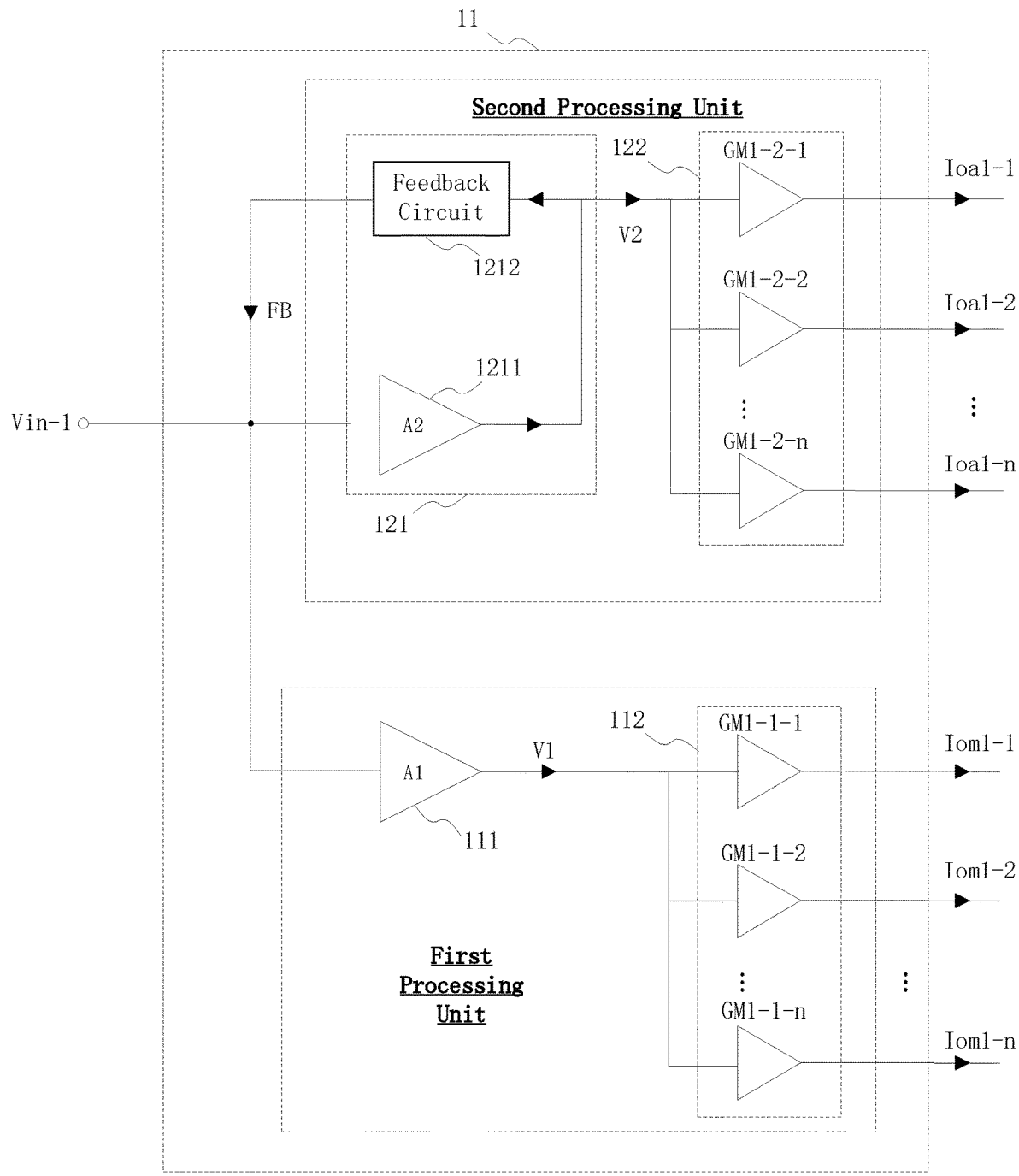
FIG. 6 shows a circuit diagram of a low-noise amplifying module in an RF front-end amplifier circuit according to an embodiment of the present disclosure.

For example, as shown in shown in FIG. 6, the phases of the first noise current and the second noise current in the low-noise amplifying module are opposite. It should be noted that FIG. 6 is only one example of the low-noise amplifying module. The phase(s) of the first noise current and/or the second noise current can be also adjusted by using components such as phase inverting amplifier in the circuit to ensure that the first noise current and the second noise current have opposite phases.

In an embodiment, the voltage output module includes at least one current combining unit and at least one current-voltage conversion unit. The number of the current combining unit is the same of the number of the current-voltage conversion unit and they are connected in a one-to-one correspondence. The number of current combining units depends on the number of tuning paths required in the system. In an embodiment, the number of current combining units is the same as the number of first current signals output by the low-noise amplifying modules, in which case, any one of the current combining units corresponds to a first current signal output by each of the low-noise amplifying modules and corresponds to a second current signal output by each of low-noise amplifying modules. Each of the current combining units is used to combine its corresponding first current signal and second current signal to obtain a fourth current signal.

Figure 7:
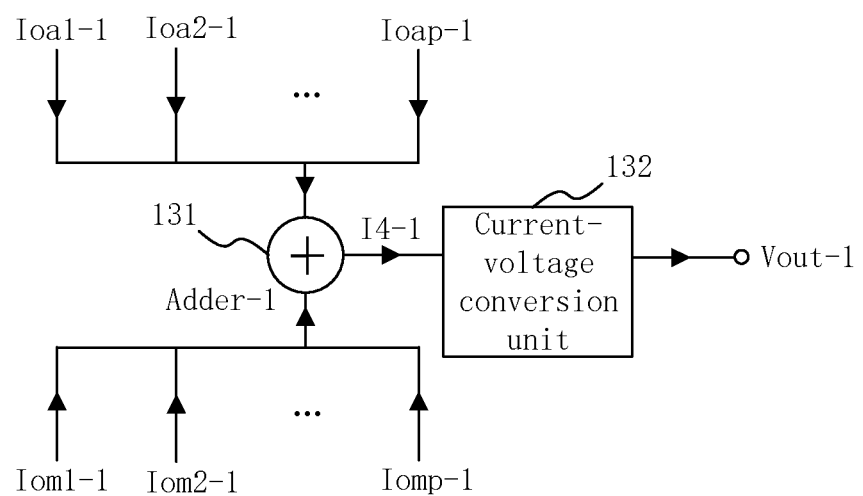
FIG. 7 shows a circuit diagram of a voltage output module of an RF front-end amplifier circuit according to an embodiment of the present disclosure.

For example, referring to FIG. 7, a current combining unit 131 corresponds to the first current signal Iom1-1 output by a first low-noise amplifying module 11, the first current signal Iom2-1 output by a second low-noise amplifying module 11, . . . , and a first current signal Iomp-1 output by a $p^{th}$ low-noise amplifying module 11, and the current combining unit 131 also corresponds to the second current signal Ioa1-1 output by the first low-noise amplifying module 11, the second current signal Ioa2-1 output by the second low-noise amplifying module 11, . . . , and a second current signal Ioap-1 output by the $p^{th}$ low-noise amplifying module 11. The current combining unit 131 combines the first current signals Iom1-1, Iom2-1, . . . , Iomp-1 and the second current signals Ioa1-1, Ioa2-1, . . . , Ioap-1 to obtain a fourth current signal I4-1. p is an integer greater than or equal to 2.

Particularly, when the first noise current and the second noise current exist in the RF front-end amplifier circuit, the current combining unit 131 is also used to combine the first noise current and the second noise current. Since the phases of the first noise current and the second noise current are opposite, the first noise current and the second noise current can be partially canceled or fully canceled after the two are combined thereby reducing the noise in the RF front-end amplifier circuit.

Each of the at least one current-voltage conversion units is respectively connected to a corresponding current-combining unit, which, for example, can be implemented with a resistive load. The fourth current signal generated by the current combining unit flows through the current-voltage conversion unit to form the one or more output voltage signals. Specifically, each of the current-voltage conversion units is used to convert a fourth current signal to obtain an output voltage signal. For example, the current-voltage conversion unit 132 converts the fourth current signal I4-1 into an output voltage signal Vout-1. The output of all the current-voltage conversion units is the output of the RF front-end amplifier circuit.

According to the above description, the RF front-end amplifier circuit can combine the first noise current and the second noise current through the current combining unit, so that the first noise current and the second noise current can be partially or fully cancelled, which is beneficial to reducing the noise generated by the second amplifier A2. Here, there is a sufficient design freedom to ensure that the second amplifier can be designed to have better performance, such as higher linearity or lower power consumption.

In an embodiment, the first current signal and the second current signal are single-ended signals. In an embodiment, the first current signal and the second current signal are differential signals. When the first current signal and the second current signal are differential signals, the RF front-end amplifier circuit can be used as a low-noise transconductance amplifier with single-ended input and differential output, in which case, the RF front-end amplifier circuit does not need to use a BALUN to receive differential signals, thereby reducing costs. In addition, the noise from the matching amplifier circuit is cancelled in the differential mode. The circuit adopts a differential form, which ensures that the circuit has good power supply rejection, common mode rejection and second-order linearity.

Figure 8A:
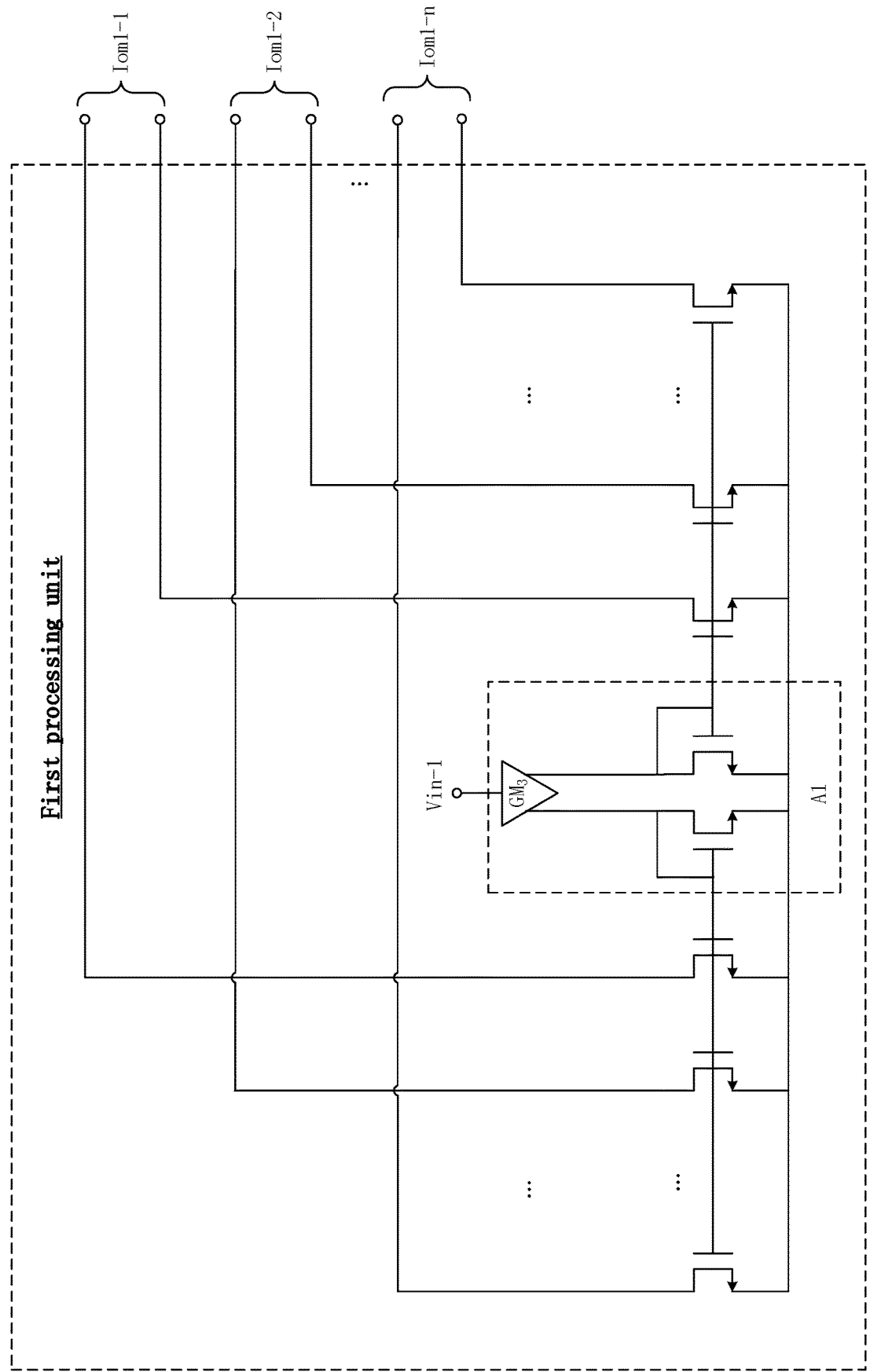
FIG. 8A shows a circuit diagram of a first processing unit of an RF front-end amplifier circuit according to an embodiment of the present disclosure.
Figure 8B:
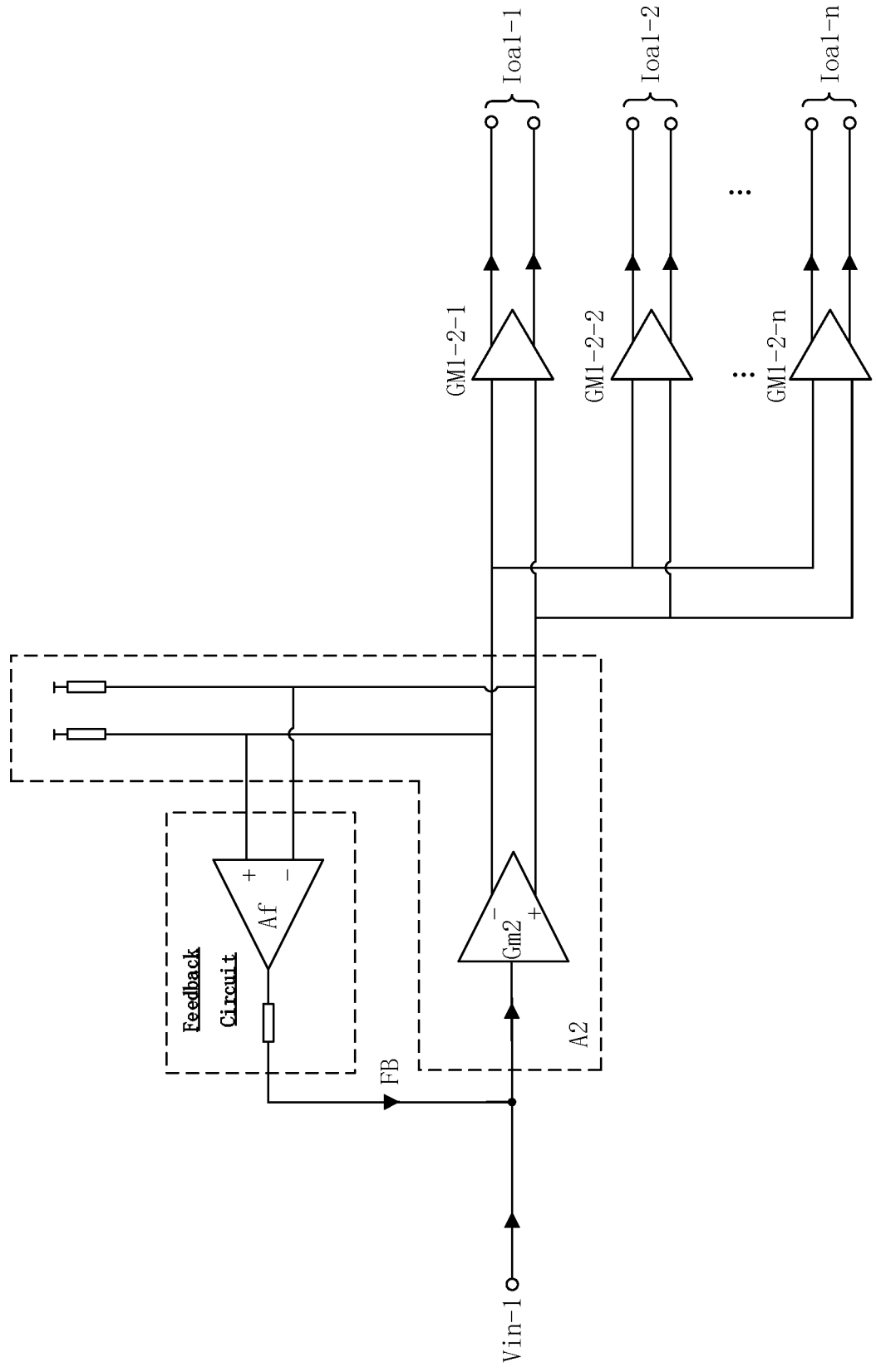
FIG. 8B shows a circuit diagram of a second processing unit of an RF front-end amplifier circuit according to an embodiment of the present disclosure.

Specifically, when the first current signal and the second current signal are differential current signals, an embodiment of the first processing module is shown in FIG. 8A. The third transconductor GM3 has a single-ended input and a differential output, and its output current is converted into the voltage on the diode-connected MOSFET, and converted back into a current by a current mirror. Due to the nature of the current mirror, although the output of the first amplifier A1 is a voltage signal, the linearity of the signal in the first processing module will not be degraded. An embodiment of the second processing module is shown in FIG. 8B, where the feedback circuit adopts a differential input single-ended output structure.

Figure 9A:
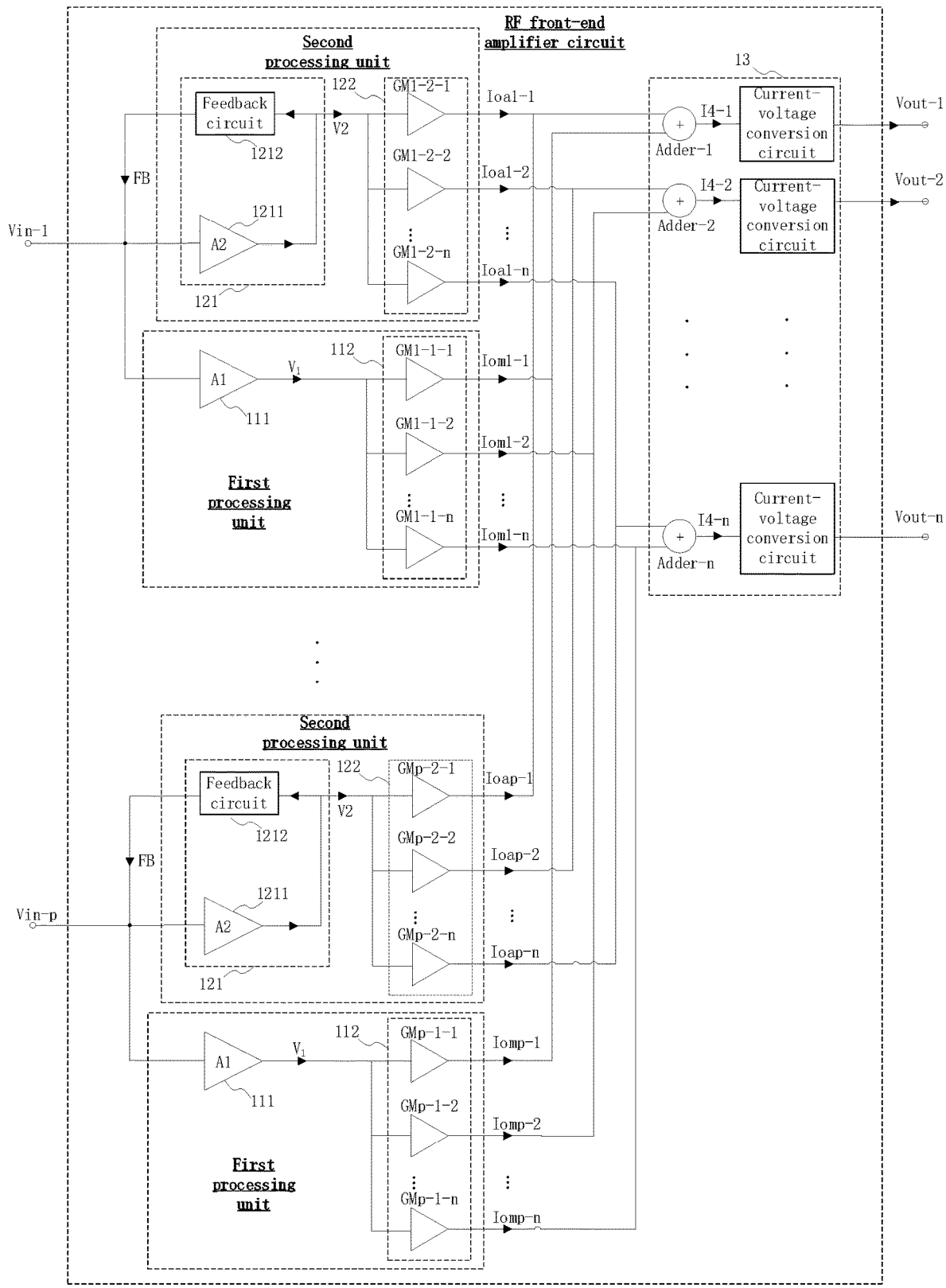
FIG. 9A shows a circuit diagram of an RF front-end amplifier circuit according to an embodiment of the present disclosure.

Referring to FIG. 9A, in an embodiment, the first current signal and the second current signal are single-ended signals. Here, the RF front-end amplifier circuit is used to amplify one or more input voltage signals and convert them into one or more voltage signals for output. The RF front-end amplifier circuit includes p low-noise amplifying modules, where p is greater than or equal to 1, and includes a voltage output module. Each of the p low-noise amplifier circuits is used to convert one input voltage signal into n first current signals and n second current signals, where n is greater than or equal to 1. Each of the voltage output modules is used to convert intermediate current signal output by the low-noise amplifying module into one or more output voltage signals.

Specifically, in an embodiment, each low-noise amplifying module includes a first processing unit and a second processing unit, and the first processing unit includes a first amplifier 111 and n switchable first transconductors. The first amplifier is used to amplify one input voltage signal input to the low-noise amplifying module to obtain a first voltage signal, and each of the n first transconductors is used to convert the first voltage signal into a first current signal. Therefore, there are n first current paths in the first processing unit, and the output of the first processing unit is n first current signals.

In an embodiment, as shown in FIG. 9A, the second processing unit includes a matching amplifier circuit 121 composed of a second amplifier 1211 and a feedback circuit 1212, and includes n switchable second transconductors. The matching amplifying circuit 121 is used to achieve impedance matching at the input terminal of the low-noise amplifying module. The second amplifier 1211 is used to amplify one input voltage signal input to the low-noise amplifying module to obtain a second voltage signal, and each of the second transconductors is used to convert the second voltage signal into one second current signal, and therefore there are n second current paths in the second processing unit. The output of the second processing unit is n second current signals.

The voltage output module 13 includes n current combining units and n current-voltage conversion units, wherein each current combining unit corresponds to p first current signals and p second current signals, and is used to combine the p first current signals and the p second current signals to obtain a fourth current signal. Each of the current-voltage conversion units is connected to its corresponding current combining unit, and is used to convert each fourth current signal into a output voltage signal.

In an embodiment as shown in FIG. 9A, the second voltage signal includes part or all of the noise voltage generated by the matching amplifying circuit. The noise voltage is transferred to the input terminal of the low-noise amplifying module through the feedback circuit, and flows through a first processing unit to form a first noise current; the noise voltage forms a second noise current after passing through the second transconductor. The RF front-end amplifier circuit can ensure that the second noise current and the first noise current have opposite phases so that after passing through the current combining unit, the first noise current and the second noise current will partially or completely cancel each other out. In an embodiment, the gain of the at least one first transconductor and the at least one second transconductor is adjustable. In specific applications, the gain of the first transconductor and/or the second transconductor can be adjusted to achieve the cancellation of the first noise current and the second noise current.

In addition, the at least one first transconductor and the at least one second transconductor are both switchable transconductors. In applications, by adjusting the switching states of the first transconductor and the second transconductor, the RF front-end amplifier circuit can convert any one or more input voltage signals into 0~n output voltage signals, and output the input voltage signal of any input terminal through any one or more output terminals. For example, the RF front-end amplifier circuit can convert the input voltage signal Vin-1 into an output voltage signal, and this one output voltage signal can be output through any output terminal; the RF front-end amplifier circuit can convert the input voltage signal Vin-1 into n output voltages and the n output voltage signals can be output through all n output terminals; the RF front-end amplifier circuit can convert the input voltage signals Vin-1 and Vin-p into four output voltage signals, the four output voltage signals can be output through any four output terminals. The on-off state of the current path (including the first current path and the second current path) in the RF front-end amplifier circuit in an embodiment is controlled by the corresponding first transconductor and second transconductor, and the first transconductor and second transconductor are switchable. The first transconductor and second transconductor, along with the current combining unit, distribute the input voltage signal of different input terminals to multiple output terminals, thereby realizing an MIMO function without using radio frequency switch, which helps to reduce signal loss and noise, and prevent the degradation of linear performance.

The current combining units in an embodiment can be designed to have a low input impedance to receive the first current signal and the second current signal from the previous stage. The low input impedance can ensure that the current combining unit receives multiple first current signals and second current signals without significant signal loss or signal distortion. The low impedance also ensures that the current combining unit to work at frequencies up to several gigahertz. In addition, the low impedance also ensures that the mutual influence between different current paths is minimal, and that noise characteristics and impedance characteristics of one path will not have a significant impact on other paths.

In addition, the first noise current and the second noise current have opposite phases, and can be partially or fully canceled, which lowers the noise generated in the entire circuit, which provides a sufficient design freedom for designing the entire circuit.

Figure 9B:
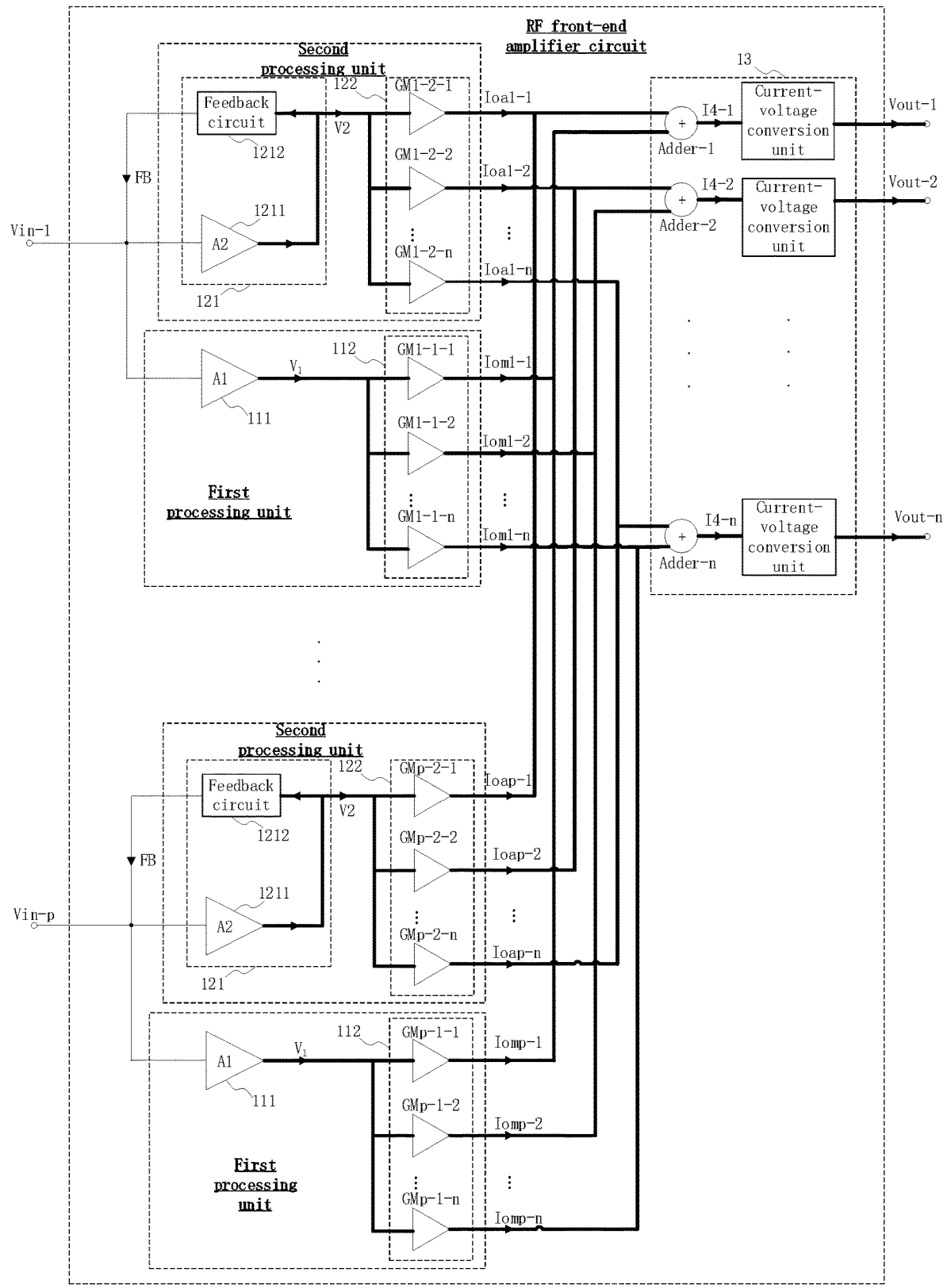
FIG. 9B shows a circuit diagram of an RF front-end amplifier circuit according to an embodiment of the present disclosure.

Referring to FIG. 9B, the RF front-end amplifier circuit can also work in a differential mode, in which case the RF front-end amplifier circuit converts single-ended input signals to differential output signals. In FIG. 9B, thick line represents path of differential signal, and thin line represents path of single-ended signal. In an embodiment, as shown in FIG. 9B, the RF front-end amplifier circuit can eliminate the need for BALUNs, which reduces costs. The noise from the matching amplifier circuit is eliminated in the differential mode. The differential mode can also ensure good power supply rejection, common mode rejection and second-order linearity.

Figure 10:
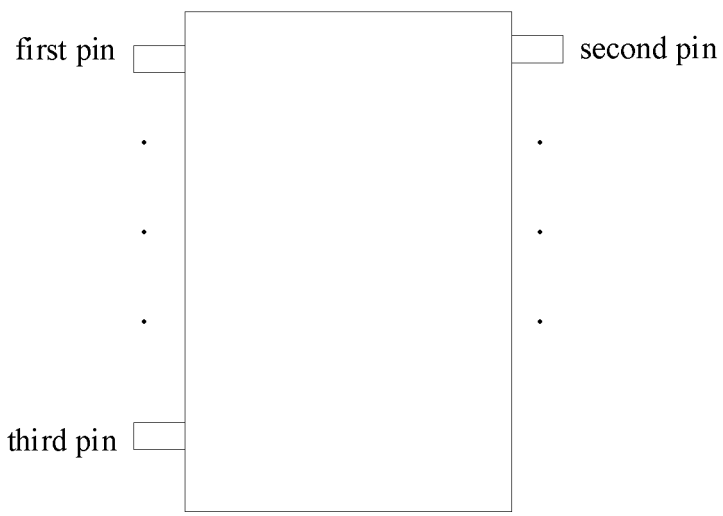
FIG. 10 shows a schematic diagram of the structure of a chip according to an embodiment of the present disclosure.

Based on the above description of the RF front-end amplifier circuit, the present disclosure also provides a chip. Referring to FIG. 10, in an embodiment, the chip includes at least part of the component in the RF front-end amplifier circuit disclosed herein. For example, the chip may include the entire RF front-end amplifier circuit, or may only include the low-noise amplifying module in the RF front-end amplifier circuit. The chip may be a saleable active device that is a packaged RF front-end amplifier circuit manufactured on a wafer using semiconductor technology; or a saleable active device that is a RF front-end amplifier circuit packaged using PCB packaging technology.

Based on the above description of the RF front-end amplifier circuit, the present disclosure also provides an electronic device, and the electronic device includes the RF front-end amplifier circuit disclosed herein. The electronic device includes, but is not limited to, a set-top box.

Figure 11:
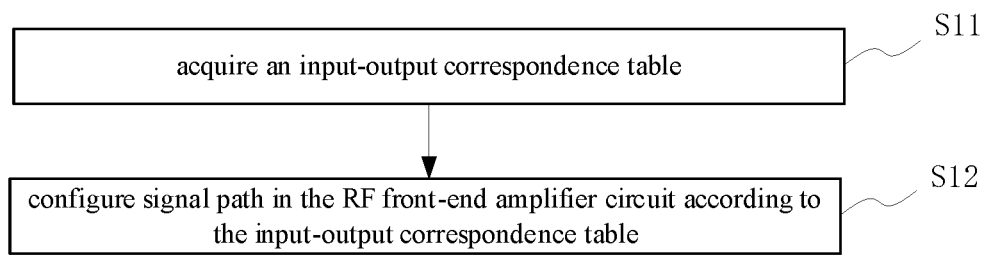
FIG. 11 shows a flowchart of a method for configuring signal path according to an embodiment of the present disclosure.

Based on the above description of the RF front-end amplifier circuit, the present disclosure also provides a method for configuring signal path, which is applied to the RF front-end amplifier circuit shown in FIG. 1, FIG. 9A or FIG. 9B. Specifically, referring to FIG. 11, in an embodiment, the method for configuring signal path includes:

S11, obtaining an input-output correspondence table. The input-output correspondence table describes the signal path from the input terminal to the output terminal, that is, the corresponding relationship between the input voltage signal and the output voltage signal. In an embodiment, the input and output correspondence table can be adjusted by a user according to actual needs. For an RF front-end amplifier circuit with p input terminals and n output terminals, Table 1 is an example of the input and output correspondence table of the RF front-end amplifier circuit.

TABLE 1 input-output correspondence table

|  | Vin-1 | Vin-2 | Vin-3 | . . . | Vin-p |
| --- | --- | --- | --- | --- | --- |
| Vout-1 | 1 | 0 | 0 | . . . | 0 |
| Vout-2 | 0 | 1 | 0 | . . . | 0 |
| Vout-3 | 1 | 0 | 0 | . . . | 0 |
| . . . | . . . | . . . | . . . | . . . | . . . |
| Vout-n-1 | 0 | 0 | 1 | . . . | 0 |
| Vout-n | 0 | 0 | 0 | . . . | 1 |

According to Table 1, the signal path in the RF front-end amplifier circuit include: the signal path from the input voltage Vin-1 to output the voltage Vout-1, the signal path from input the voltage Vin-1 to an output voltage Vout-3, the signal path from an input voltage Vin-2 to the output voltage Vout-2, the signal path from an input voltage Vin-3 to an output voltage Vout-n-1, . . . , the signal path from an input voltage Vin-p to an output voltage Vout-n.

S12, configuring the signal path in the RF front-end amplifier circuit according to the input-output correspondence table. In particular, when the RF front-end amplifier circuit uses the at least one first transconductor to convert the first voltage signal into the one or more first current signals and uses the at least one second transconductor to convert the second voltage signal into the one or more second current signals, with a circuit structure as shown in FIG. 9A or FIG. 9B, step S12, further includes configuring a transconductance module control array according to the input-output correspondence table, and controlling the on and off states of the at least one first transconductor and the at least one second transconductor according to the transconductance module control array, so as to realize signal path needed. Specifically, for an RF front-end amplifier circuit with p input terminals and n output terminals, the transconductance module control array is an n×p matrix, the number of rows corresponds to n output terminals, and the number of columns corresponds to p input terminals, and each element in the matrix is used to control the on-and-off of one signal path. Each signal path includes a first transconductor and a second transconductor. Only when the first transconductor and the second transconductor are both in the "on" state is the signal path in the "on" state. Therefore, the on-and-off states of the at least one first transconductor and the at least one second transconductor in the RF front-end amplifier circuit can be controlled according to the transconductance module control array, thereby realizing the configuration of the signal path.

Table 2 is an example of the transconductance module control array. The signal path from the input voltage Vin-1 to the output voltage Vout-1 includes the first transconductor GM1-1-1 and the second transconductor GM1-2-1. The on and off states of the first transconductor GM1-1-1 and the second transconductor GM1-2-1 can be controlled by GM1-1 in the transconductance module control array, for example: when the value of GM1-1 is 0, the first transconductor GM1-1-1 and the second transconductor GM1-2-1 are controlled to be disconnected at the same time, in which case, the signal path from the input voltage Vin-1 to the output voltage Vout-1 is disconnected; when the value of GM1-1 is 1, the first transconductor GM1-1-1 and the second transconductor GM1-2-1 are controlled to be turned on at the same time, in which case the signal path from the input voltage Vin-1 to the output voltage Vout-1 is turned on.

TABLE 2

| transconductance module control array | | | | |
|---|---|---|---|---|
| GM1-1 | GM2-1 | GM3-1 | ... | GMp-1 |
| GM1-2 | GM2-2 | GM3-2 | ... | GMp-2 |
| GM1-3 | GM2-3 | GM3-3 | ... | GMp-3 |
| ... | ... | ... | ... | ... |
| GM1-n-1 | GM2-n-1 | GM3-n-1 | ... | GMp-n-1 |
| GM1-n | GM2-n | GM3-n | ... | GMp-n |

The scope of the present disclosure regarding the method for configuring signal path is not limited to the order of the steps listed herein. Any modification of the prior art based on the principles of the present disclosure falls within the scope of disclosure of this application.

The present disclosure provides an Multiple Inputs Multiple Outputs RF front-end amplifier circuit, which can achieve low-noise, broadband impedance matching and good linearity in all signal receiving paths. The RF front-end amplifier circuit achieves noise cancellation by superimposing the first current noise and the second current noise, which have opposite phases. The noise cancellation is effective for each signal path, so that a design freedom for designing a circuit with low-noise and high linearity at the same time is obtained. Also, the RF front-end amplifier circuit does not require radio frequency switches, which helps prevent noise and linear performance degradation. In addition, the interaction between different signal paths in the RF front-end amplifier circuit is minimal, and the noise and impedance characteristics of one path have less impact on other paths.

While particular elements, embodiments, and applications of the present disclosure have been shown and described, it is understood that the disclosure is not limited thereto because modifications may be made by those skilled in the art, particularly in light of the foregoing teaching. It is therefore contemplated by the appended claims to cover such modifications and incorporate those features which come within the spirit and scope of the disclosure.

What is claimed is:

1. An RF front-end amplifier circuit, for amplifying one or more input voltage signals and converting them into one or more output voltage signals, wherein the RF front-end amplifier circuit comprises:
   at least two low-noise amplifying modules, wherein each of the low-noise amplifying modules is used to amplify and convert an input voltage signal into one or more intermediate current signals; and
   a voltage output module, connected to each of the low-noise amplifying modules and used to combine and convert the intermediate current signal output by each of the low-noise amplifying modules into the one or more output voltage signals,
   wherein the intermediate current signal comprises one or more first current signals and one or more second current signals, wherein the low-noise amplifying module comprises:
   a first processing unit, which amplifies and converts an input voltage signal input to the low-noise amplifying module into the one or more first current signals; and
   a second processing unit, which achieves impedance matching at an input terminal of the low-noise amplifying module, and amplifies one input voltage signal input to the low-noise amplifying module and converts it into the one or more second current signals, wherein the number of the second current signals is the same as the number of the first current signals.

2. The RF front-end amplifier circuit according to claim 1, wherein the first processing unit comprises:
   a first amplifier, which amplifies an input voltage signal input to the low-noise amplifying module to obtain a first voltage signal; and
   at least one switchable first transconductor; each of the first transconductor is connected to the first amplifier, and converts the first voltage signal into a first current signal.

3. The RF front-end amplifier circuit according to claim 2, wherein the first amplifier comprises:
   a third transconductor, which converts an input voltage signal input to the low-noise amplifying module into a third current signal; and
   a first MOSFET,
   wherein a gate and a drain of the first MOSFET are connected, the gate is connected to each of the at least one first transconductor to form at least one current mirror, and the drain is connected to the third transconductor,
   wherein the first MOSFET generates the first voltage signal on the gate based on the third current signal.

4. The RF front-end amplifier circuit according to claim 1, wherein the second processing unit comprises:

a matching amplifying circuit, which achieves impedance matching at the input terminal of the low-noise amplifying module, amplifies an input voltage signal input to the low-noise amplifying module to obtain a second voltage signal, converts the second voltage signal into a feedback signal and feeds it back to the input terminal of the low-noise amplifying module; and at least one switchable second transconductor, wherein each of the second transconductor is connected to the matching amplifying circuit, and converts the second voltage signal into the one of the second current signals.

5. The RF front-end amplifier circuit according to claim 4, wherein the matching amplifying circuit comprises:
a second amplifier, which amplifies one input voltage signal input to the low-noise amplifying module to obtain the second voltage signal; and
a feedback circuit, connected to the second amplifier and the input terminal of the low-noise amplifying module, wherein the feedback circuit converts the second voltage signal into the feedback signal and feeds it back to the input terminal of the low-noise amplifying module.

6. The RF front-end amplifier circuit according to claim 1, wherein the voltage output module comprises:
at least one current combining unit, which combines the first current signal and the second current signal output by at least two low-noise amplifying modules to obtain a fourth current signal; and
at least one current-voltage conversion unit, respectively connected to a corresponding current combining unit, wherein the at least one current-voltage conversion unit converts the fourth current signal into the output voltage signal.

7. The RF front-end amplifier circuit according to claim 1, wherein
the first current signal and the second current signal are single-ended signals, or
the first current signal and the second current signal are differential signals.

8. A chip, wherein the chip comprises an RF front-end amplifier circuit according to claim 1.

9. A method for configuring signal path,
wherein the method for configuring signal path is applied in an RF front-end amplifier circuit for amplifying one or more input voltage signals and converting them into one or more output voltage signals,
wherein the RF front-end amplifier circuit comprises at least two low-noise amplifying modules and a voltage output module,
wherein each of the low-noise amplifying modules is used to amplify and convert an input voltage signal into one or more intermediate current signals,
wherein the voltage output module is connected to each of the low-noise amplifying modules and used to combine and convert the intermediate current signal output by each of the low-noise amplifying modules into the one or more output voltage signals,
wherein the method for configuring signal path comprises:
acquiring an input-output correspondence table, wherein the input-output correspondence table describes the correspondence between the input voltage signal and the output voltage signal; and
configuring signal path in the RF front-end amplifier circuit according to the input-output correspondence table.

* * * * *